United States Patent
Koeppe et al.

(10) Patent No.: US 6,844,792 B1
(45) Date of Patent: Jan. 18, 2005

(54) SINGLE ENDED TUNING OF A DIFFERENTIAL POWER AMPLIFIER OUTPUT

(75) Inventors: James Koeppe, San Carlos, CA (US); Tom McKay, Felton, CA (US); Vas Postoyalko, Wakefield (GB)

(73) Assignee: Zeevo, Santa Clara, CA (US)

( * ) Notice: Subject to any disclaimer, the term of this patent is extended or adjusted under 35 U.S.C. 154(b) by 145 days.

(21) Appl. No.: 10/253,460

(22) Filed: Sep. 23, 2002

Related U.S. Application Data

(60) Provisional application No. 60/381,387, filed on May 15, 2002.

(51) Int. Cl.⁷ .............................. H03H 7/00
(52) U.S. Cl. ................ 333/24 R; 333/26; 333/35
(58) Field of Search ............... 333/24 R, 26, 333/25, 128, 33, 32, 35, 238, 246; 330/302, 292

(56) References Cited

U.S. PATENT DOCUMENTS

| | | | |
|---|---|---|---|
| 5,584,053 A | * 12/1996 | Kommrusch et al. | 455/82 |
| 5,673,003 A | * 9/1997 | Zocher | 330/305 |
| 6,294,965 B1 | * 9/2001 | Merrill et al. | 333/26 |
| 6,441,696 B1 | * 8/2002 | Westberg | 333/26 |
| 6,466,770 B1 | * 10/2002 | Griffith et al. | 455/91 |
| 6,670,866 B2 | * 12/2003 | Ella et al. | 333/133 |

OTHER PUBLICATIONS

Choonsik Cho, "A New Design Procedure for Single–Layer and Two–Layer Three–Line Baluns", IEEE Transactions On Microwave Theory And Techniques, vol. 46, No. 12, Dec. 1998.

* cited by examiner

*Primary Examiner*—Robert Pascal
*Assistant Examiner*—Kimberly Glenn
(74) *Attorney, Agent, or Firm*—Martine & Penilla LLP

(57) ABSTRACT

A system and method for compensating a parasitic capacitance on a differential amplifier output includes a first differential output and a second differential output of the differential amplifier. The first differential output coupled to the second differential output by a first conductor that has a length of about one half wavelength. The first and the second differential outputs have a parasitic capacitance that can be measured. A second conductor is coupled to the first differential output. The second conductor having a length that is less than or equal to about one quarter wavelength and has an inductive reactance that offsets a capacitive reactance of the parasitic capacitance.

19 Claims, 5 Drawing Sheets

SINGLE ENDED TUNING OF A DIFFERENTIAL POWER AMPLIFIER OUTPUT

CROSS REFERENCE TO RELATED APPLICATIONS

This application claims priority from U.S. Provisional Patent Application No. 60/381,387 filed on May 15, 2002 and entitled "Package Filter Combiner Network," by Inventor Tom McKay, which is incorporated herein by reference in its entirety.

BACKGROUND OF THE INVENTION

1. Field of the Invention

The present invention relates generally to systems and methods of tuning power amplifier outputs and more particularly, to systems and methods for tuning a single output of a differential power amplifier.

2. Description of the Related Art

Transceiver power efficiency is greatly dependant on the efficiency of the transmitter power amplifier (PA). An efficient PA converts as much of the bias current to RF output as possible. PA efficiency is especially important in portable transceiver systems that rely on a portable power source (e.g., battery) or other transmitters that have a limited power supply. Many portable transmitters are manufactured as highly integrated circuits (i.e., transmitter on a chip) so as to exploit the power efficiencies of integrated circuit design.

Some of the potential transmitter inefficiencies can be eliminated or significantly reduced in the design of the integrated power amplifier components. However, an integrated PA must still be connected to an antenna, impedance matching network, balancing circuits and other components that are external to the transmitter on a chip. These external connections result in at least some parasitic capacitance in the output of the PA that cannot be eliminated in or efficiently compensated for on the chip.

FIG. 1 shows a block diagram of a typical prior art transceiver 100. The transceiver 100 includes an integrated transmitter 104 that includes a differential power amplifier 110. The transceiver 100 also includes a front-end circuit 102. The front-end circuit 102 includes a balun 114. The differential PA 110 has a positive potential output 110$p$ and negative potential output 110$n$. The outputs 110$p$ 110$n$ of the PA 110 are coupled to the corresponding inputs 114$p$, 114$n$ of the balun 114. The output 114A of the balun 114 is coupled to an antenna 120.

The balun 114 is a balanced signal to unbalanced signal converter circuit that converts the balanced input signals 110$n$, 110$p$ to an unbalanced or single pole output signal 114A, such as may be coupled to a single pole antenna 120 to output a transmitter output signal. Each of the components in the front-end circuit 102 (e.g., the balun 114, the antenna 120 and the interconnecting wires) has some level of parasitic capacitance that can load or otherwise degrade the efficiency of the PA 110.

Prior art approaches to manage parasitic output capacitance of the PA 110 include placing one or more inductors in the front-end circuit 102 (e.g., inductors 124$p$, 124$n$) or one or more inductors (e.g., inductors 126$p$, 126$n$) in the transmitter 104 (i.e., within the same chip as the transmitter 104). However, an effective integrated inductor consumes too much precious space within the transmitter chip 104. Therefore placing an inductor within the transmitter 104 is an inefficient use of the available space on the chip 104 and therefore significantly increases the cost.

Placing an inductor in the front-end circuit 102 can require the inductor to be individually tuned to fit the precise needs of the output of the PA 110. Further, the inductive component variations between manufacturers or even slight variations in the installation of the inductors in the front-end circuit can require still additional tuning.

Maximum power transfer occurs when the input impedance of the balun 114 is the complex conjugate of the PA output impedance $Z_{PA\_out}$. Nominally, the PA output impedance is designed to be entirely resistive $R_{PA\_out}$, but ultimately at least some on-chip parasitic capacitance $X_{PA\_out}$ cannot be avoided. Therefore, for maximum power transfer the balun input impedance must have an equal resistive part $R_{balun}$ with an inductive reactance $X_{balun}$ as shown by the following relationships:

$$Z_{PAout} = R_{PAout} + X_{PAout}$$

$$Z_{balun} = R_{balun} + X_{balun}$$

$$R_{PAout} = R_{balun}$$

$$X_{PAout} = -X_{balun}$$

As shown in the above relationships, the balun input impedance $Z_{balun}$, must appear to be inductive to the PA 110 while maintaining balun functionality and differential balance in the PA 110 output.

FIG. 2 shows a block diagram of another prior art power amplifier output circuit 200. The differential power amplifier outputs PA+ 204 and PA− 206 are input to a balun 202. The DC bias for the power amplifier is routed through two DC bias networks 207A, 207B. DC bias for the positive PA output 204 is supplied through DC bias network 207A while DC bias for the negative PA output 206 is supplied through DC bias network 207B. DC bias network 207A includes a quarter wavelength ($\lambda$/4) stub 210A and DC bias network 207B includes a quarter wavelength ($\lambda$/4) stub 210B. A quarter wavelength stub acts as an open to RF, therefore, the quarter wavelength stubs 210A, 210B protect the DC bias supplies 212A, 212B by blocking RF from being fed back through the DC bias networks 207A, 207B from the PA outputs 204, 206.

Another prior art approach was to apply varying lengths of tuning stubs 214A, 214B to the respective PA outputs 204, 206. By way of example, a first tuning stub 214A could be connected to the positive PA output 204 and a second tuning stub 214B could be connected to the negative PA output 206. However, these two tuning stubs 214A, 214B must have precisely the same dimensions, with very close tolerances. If the two tuning stubs 214A, 214B were not precisely the same dimensions, they could create additional imbalances on the PA output. The length of the tuning stubs 214A, 214B is adjusted to provide the desired tuning function (i.e., to compensate for parasitic capacitance presenting the PA outputs 204, 206).

Still another approach was to put more than one stub on each of the balanced PA outputs 204, 206. However, each of these stubs can provide yet additional capacitance and additional variation that could cause still more imbalances that must be corrected.

What is needed is a system and method to make a device in the front-end circuit, such as a balun, that appears to be inductive to the output of the PA and that will also compensate for the parasitic capacitance of the PA output connections. In addition, the compensation must maintain balance of the PA outputs while also protecting the DC bias source from any RF output from the PA.

SUMMARY OF THE INVENTION

Broadly speaking, the present invention fills these needs by providing a system and method for tuning a single end (output) of a differential power amplifier. It should be appreciated that the present invention can be implemented in numerous ways, including as a process, an apparatus, a system, computer readable media, or a device. Several inventive embodiments of the present invention are described below.

A system and method for compensating a parasitic capacitance on a differential amplifier output includes a first differential output and a second differential output of the differential amplifier. The first differential output coupled to the second differential output by a first conductor that has a length of about one half wavelength. The first and the second differential outputs have a parasitic capacitance that can be measured. A second conductor is coupled to the first differential output. The second conductor having a length that is less than or equal to about one quarter wavelength and has an inductive reactance that offsets a capacitive reactance of the parasitic capacitance.

The second conductor can include a DC bias network.

The first conductor that has a length of about one half wavelength can include a length of about one half wavelength plus a multiple of one half wavelength.

The second conductor having a length that is equal to or less than about one quarter wavelength can include a length that is equal to or less than about one quarter wavelength plus a multiple of one half wavelength.

The first conductor can be formed such that a signal cross coupling between portions of the first conductor is minimized. The second conductor can be formed such that a signal cross coupling between portions of the second conductor is minimized. The first conductor and the second conductor can be separated such that a signal cross coupling between the first conductor and the second conductor is minimized.

In one embodiment, the system and method can include a balun. The balun includes a primary portion and a secondary portion. The primary portion includes the first conductor. The secondary portion includes a third conductor and a fourth conductor. The third conductor and the fourth conductor each have a length equal to about one quarter wavelength. The fourth conductor can be coupled between a ground potential and an antenna port. The third conductor and the fourth conductor can be substantially aligned with the first conductor so as to maximize a signal cross coupling from the first conductor to the third conductor and the fourth conductor.

The balun can be formed in a multi-layer structure. The first conductor can be formed on a first layer of the multi-layer structure and the third conductor and the fourth conductor can be formed on a second layer of the multi-layer structure. An insulating third layer of the multi-layer structure separates the first layer and the second layer. The balun could also be formed in a coupled line structure.

The transmitter output circuit can also be included in a package such as an LTCC package.

One embodiment includes a DC bias network for supplying bias current to a differential amplifier. The DC bias network includes a first conductor. The first conductor is coupled between a DC bias source and a first output of the differential amplifier. A second output of the differential output is coupled to the first output by a second conductor having a length of about one half wavelength. The first conductor has a length of about one quarter wavelength and an inductive reactance equal to a parasitic capacitive reactance on the first output and the second output of the differential amplifier. The DC bias network can also be included in a package that includes an amplifier output circuit.

In one embodiment a method of compensating for a parasitic capacitance on a differential amplifier output includes coupling a first differential output of the differential amplifier to a second differential output of the differential amplifier with a first conductor having a length of about one half wavelength. A second conductor is coupled to the first differential output of the differential amplifier. The second conductor has a length of about one quarter wavelength and an inductive reactance equal to a parasitic capacitive reactance on the first output and the second output of the differential amplifier.

The present invention provides the advantage of a single compensation device that provides a balanced compensation for the parasitic output capacitance of the differential amplifier outputs.

Other aspects and advantages of the invention will become apparent from following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Several exemplary embodiments for single-ended tuning of a differential power amplifier (PA) output will now be described. It will be apparent to those skilled in the art that the present invention may be practiced without some or all of the specific details set forth herein.

The prior art approaches required each of the differential outputs of a differential PA output to be manipulated to compensate for the parasitic capacitance. The manipulations typically included one or more RF stubs added to the PA output circuitry. The prior art RF stubs were required to be very precise and very symmetrical to maintain the balance of the differential outputs. Any variation in the RF stubs could result in additional parasitic capacitance or parasitic conductance or other imbalances.

One embodiment of the present invention includes coupling the differential PA outputs with a conductive line that has a length that is a function of the wavelength divided by two (i.e., $\lambda/2$, $\lambda$, $3\lambda/2$, etc.). Conductors having a length that is a multiple of one half wavelength (i.e., $\lambda/2$) are seen by the RF as an electrical short according to the Smith Chart. Therefore, a single parasitic compensation element on only one of the balanced outputs of the PA will be seen equally on both of the balanced outputs of the PA. Because only a single parasitic compensation element is used there is no longer a requirement of symmetry, thereby simplifying the overall circuit construction and thereby allowing the manufacturing tolerances to be substantially reduced, which also reduces cost and simplifies construction.

Therefore, once the specific parasitic capacitance of the PA outputs is determined then an exact compensating inductive reactance will also be known. Given the compensating reactance required and the material that the single compensating element will be formed in, the correct dimensions of the single compensating element can be determined. Further, the single compensating element must also maintain adequate separation with itself and other components so as to substantially eliminate any undesired cross coupling.

As discussed above, the prior art used a quarter wavelength (λ/4) RF stub as the PA bias network because a quarter wavelength stub was an open to RF and therefore would protect bias supply from any RF. However, if the bias current source is able to tolerate some level of RF, then the PA bias network is not limited to a precise quarter wavelength RF stub and the DC bias network can therefore be adjusted to be more or less than a quarter wavelength.

An RF stub that has a length less than a quarter wavelength is an inductance according to the Smith Chart. Alternatively adding any multiple of half wavelengths to a length less than quarter wavelength stub is also inductive. By way of example, the stub is inductive if it is between 0 to λ/4 or between λ/2 and 3λ/4, or λ and 5λ/4, etc.

Figure 1:
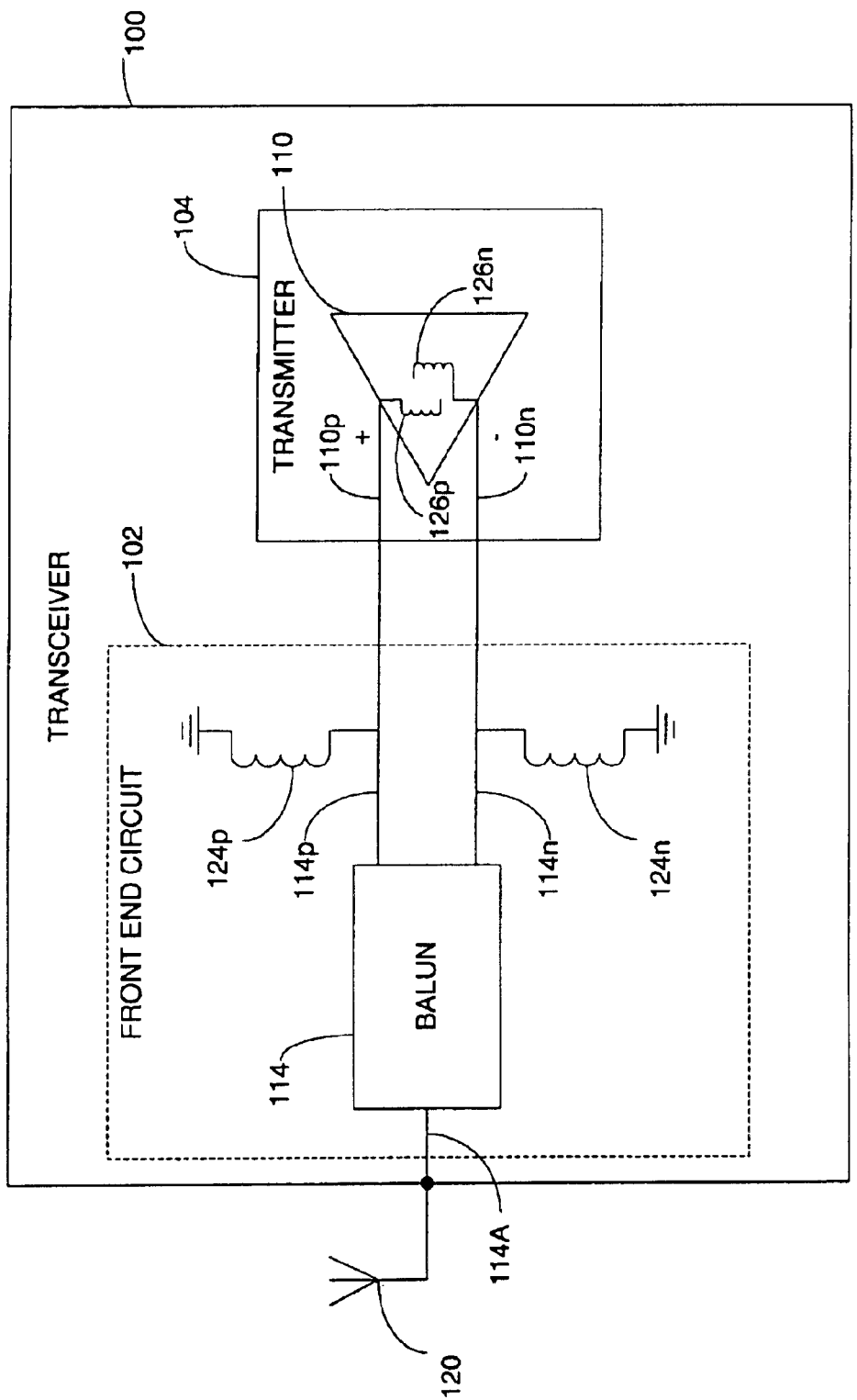
FIG. 1 shows a block diagram of a typical prior art transceiver.
Figure 2:
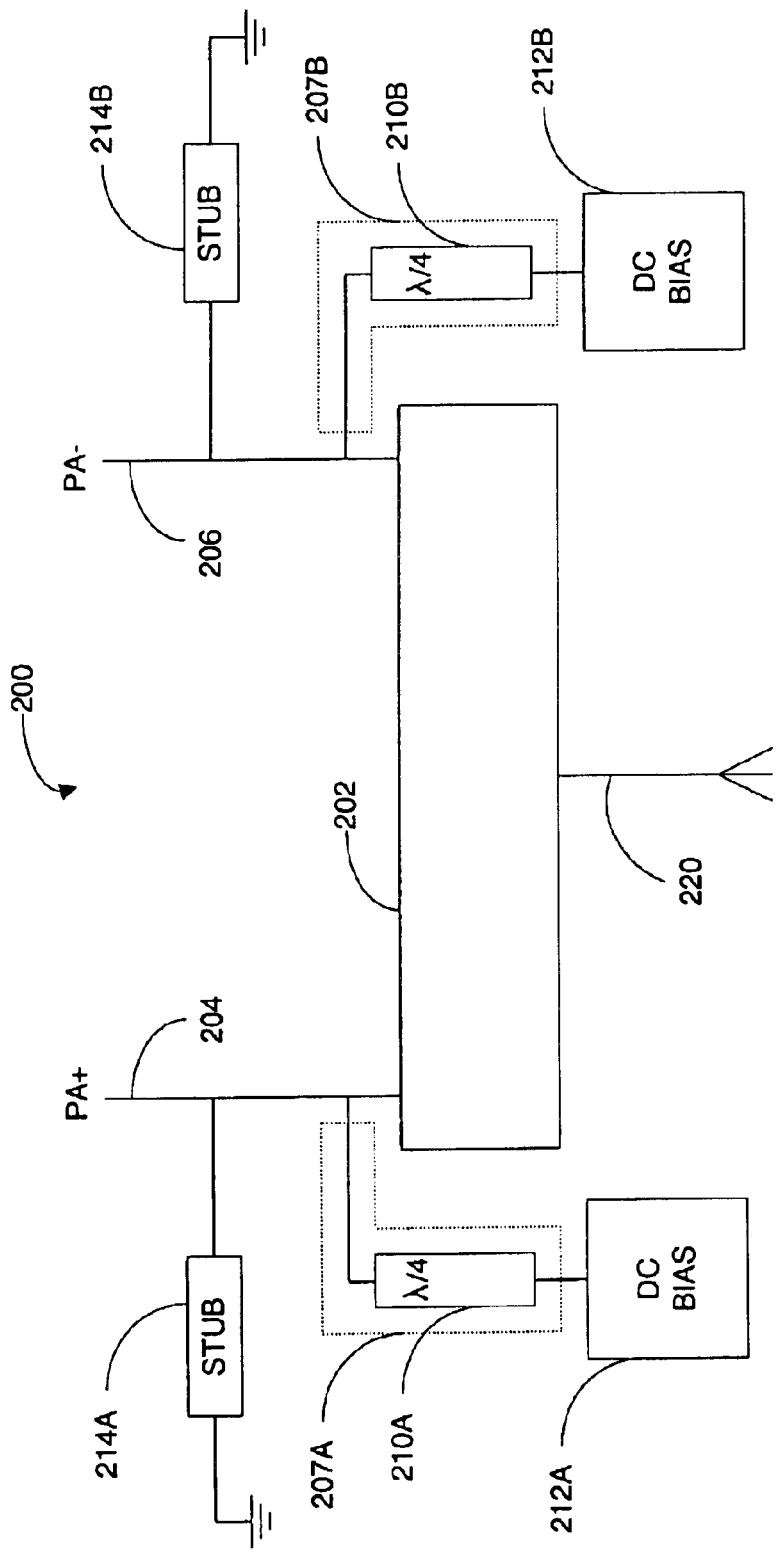
FIG. 2 shows a block diagram of another prior art power amplifier output circuit.
Figure 3:
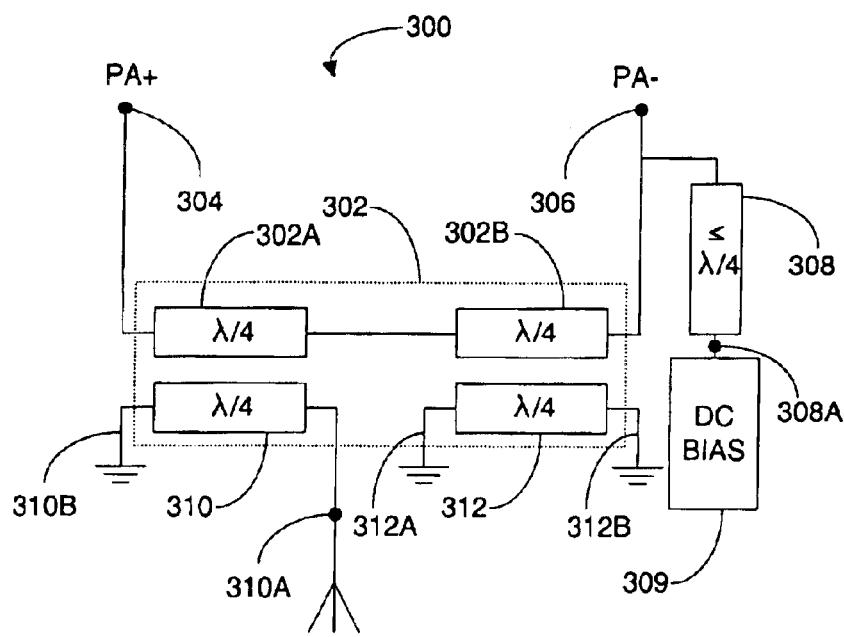
FIG. 3 shows one embodiment of a transmitter front-e nd (e.g., output) circuit according to one embodiment of the present invention.

FIG. 3 shows one embodiment of a transmitter front-end (e.g., output) circuit 300 according to one embodiment of the present invention. The transmitter output circuit 300 includes a first conductor 302 that is coupled between the differential power amplifier outputs 304 and 306. The first conductor 302 has a length of about one-half of one wavelength of the center frequency of the output RF of the PA. The first conductor also forms two input portions 302A, 302B to a balun 302. The input portions 302A, 302B each have a length of about quarter wavelength. The balun 302 output includes coupled conductors 310, 312. Each of the conductors 310, 312 is also about one quarter wavelength in length. The transmitter output circuit 300 also includes a DC bias network 308 that includes a second conductor that is less than or equal to one-quarter wavelength of the center frequency.

The specific dimensions of the first conductor 302 and the second conductor 308 may not exceed certain lengths. By way of example, both the first conductor 302 and the second conductor 308 must be equal to or slightly less than the respective lengths stated above, plus a multiple of one-half wavelength. The well-known Smith Chart is known in the art as a reliable source for calculating reactants at one-quarter wavelength of a given frequency. According to the Smith Chart, a one-quarter wavelength stub (i.e., conductor) appears as an open to that frequency. Similarly, according to the Smith Chart, a half wavelength stub or conductor appears to be a short to that frequency. As a result, if the first conductor 302 is about one-half wavelength in length, then it appears to be a short to both of the PA outputs 304 and 306 and therefore a single compensation of the parasitic capacitance of the PA outputs 304 and 306 will be felt the same on each of the PA outputs 304, 306.

Also according to Smith Chart, a conductor that is between zero and one quarter wavelength in length is inductive while a conductor that is between one quarter wavelength and one half wavelength in length is capacitive. Therefore, if the single compensation is an inductive compensation then a conductor that is between zero and one-quarter wavelength in length could be used.

Figure 4:
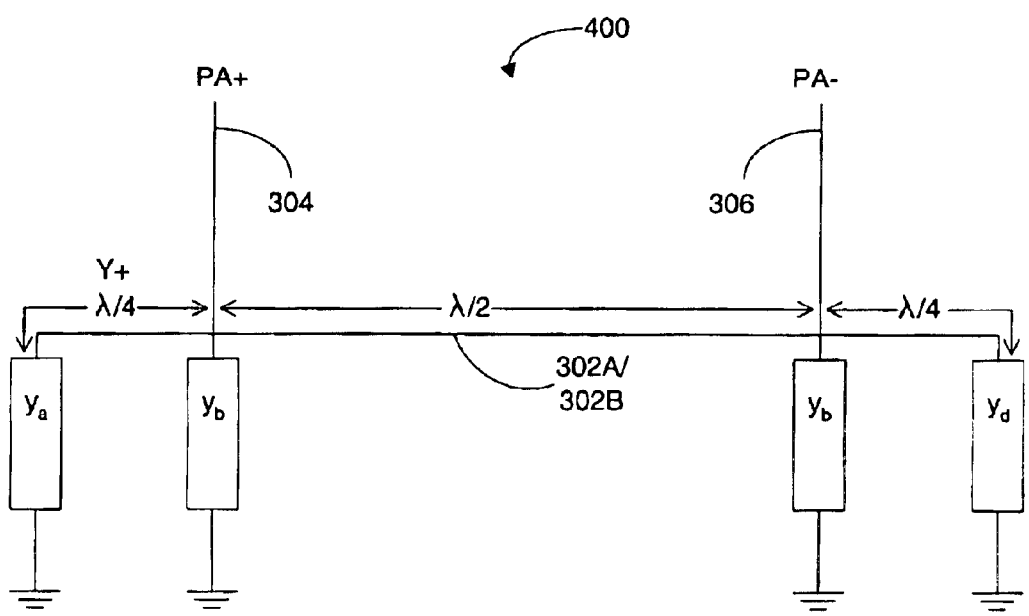
FIG. 4 shows a block diagram of the components discussed in FIG. 3 above.

FIG. 4 shows a block diagram of the components discussed in FIG. 3 above. FIG. 4 shows the differential PA outputs 304 and 306 coupled by a first conductor 302 that is one-half wavelength in length. Five admittances are shown, one for each section of the balun. $Y_a$ is the admittance of the coupled quarter wavelength section on the antenna. $Y_t$ is the characteristic of the admittance of the quarter wavelength transmission line. $Y_b$ is the admittance of the balun from each of PA outputs 304 and 306. The admittance of both are equal since the coupled sections of the balun are symmetric. Yd is the admittance of the DC bias network (i.e., the second conductor 308). To show differential symmetry, the input admittances at both PA outputs 304, 306 are shown to be equal. It can be deduced that the balun not only performs signal conversion from balanced to unbalanced, but also achieves impedance transformation.

$$Y_{pa+}=(Yt^2/Y_a)+2Y_b+Y_d$$

and $$Y_{pa-}=(Yt^2/Y_a)+2Y_b+Y_d$$

The first conductor 302 acts as an RF short between the PA outputs 304, 306. Therefore, a single inductive conductor 308 added to only one of the PA outputs 304, 306 can compensate for the parasitic capacitance. The single inductive conductor 308 will be mirrored differentially, across both sides of the balun and therefore does not upset the balance of the balun input.

FIGS. 5A–D illustrate a transmitter front-end circuit 580, such as the front-end circuit 300 shown in FIG. 3 above, that is formed in a multi-layer coupled-line structure according to one embodiment of the present invention. In one embodiment the transmitter front-end circuit 580 is formed in an LTCC (low temperature co-fired ceramic) structure. Alternatively, the transmitter front-end circuit 580 is formed in any coupled-line type media.

Figure 5A:
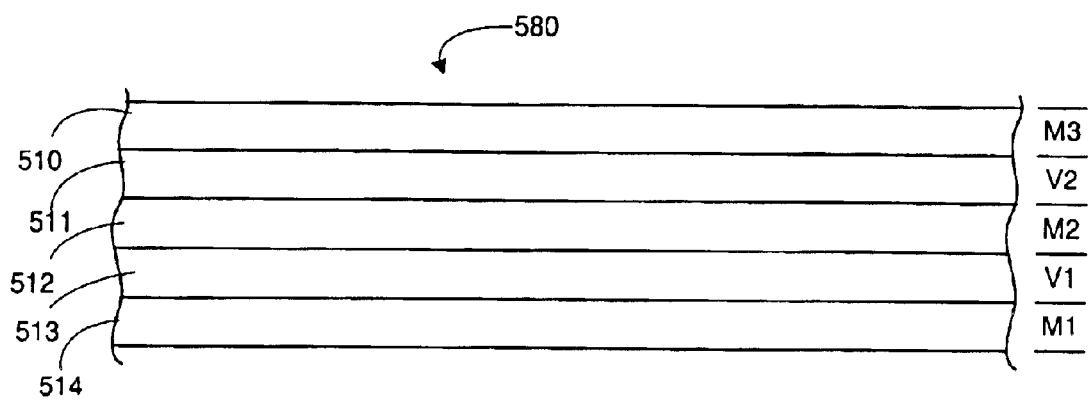
FIGS. 5A–D illustrate a transmitter front-end circuit, such as the front-end circuit shown in FIG. 3 above, that is formed in a multi-layer coupled-line structure according to one embodiment of the present invention.

Referring to FIG. 5A, the transmitter front-end circuit 580 includes multiple layers 510–513. The multiple layers 510–513 include alternating conductive (i.e., metallic) layers 510, 512, 514 and insulating or via layers 511, 513 that insulate the conductive layers 510, 512, 514 except where specifically located interconnections or vias are desired, as will be described in more detail below. While only five layers (e.g., layers 510–513) are illustrated, more or less layers could also be used. The thickness of the respective layers 510–513 is not necessarily to scale. The layers 510–513 may be of differing thickness.

Figure 5B:
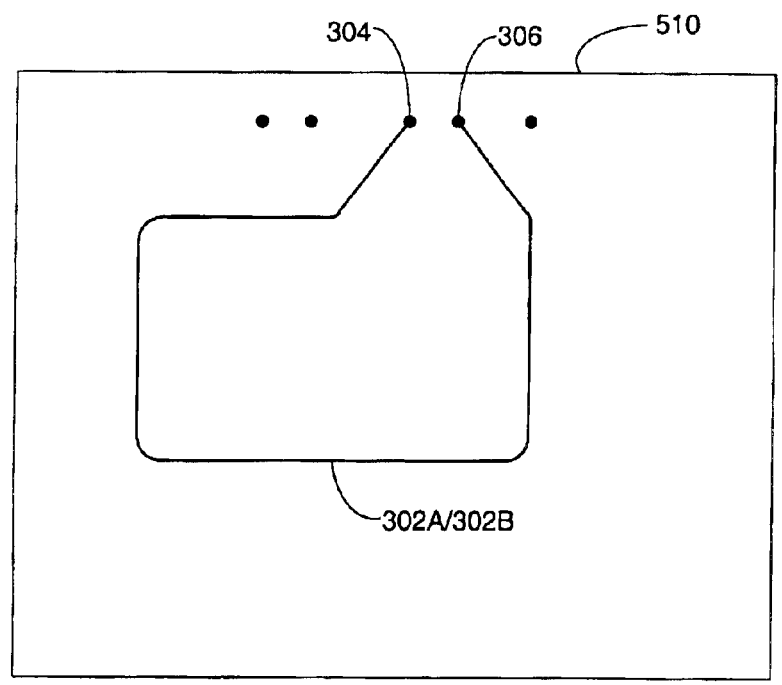

Referring now to FIG. 5B, wherein the input portion of a balun such as balun 302 in FIG. 3 above, is formed in a conductive layer 510. As described above in FIG. 3, the input portion of the balun 302 includes one line structure 302A/302B that is about one half wavelength in length. Because the line structure 302A/302B is about one half wavelength in length each half of the line structure can be equivalent to the two one quarter wavelength portions 302A, 302B as shown in FIG. 3. The differential PA outputs 304, 306 are connected to the ends of the line structure 302A/302B so that the length of the conductor between the PA outputs 304, 306 is about one half wavelength in length, thereby forming an RF short as described in FIGS. 3 and 4 above. The line structure 302A/302B is shaped and separated such that the line any signal cross coupling within the line structure 302A/302B is minimized.

Referring again to FIG. 5A, an insulating via layer 511 is formed between the conductive layer 510 and another conductive layer 512. The insulating via layer 511 includes only those interconnecting vias as are required to form connection between the two conductive layer 510, 512 as are well known in the art in multi-layer structures.

Figure 5C:
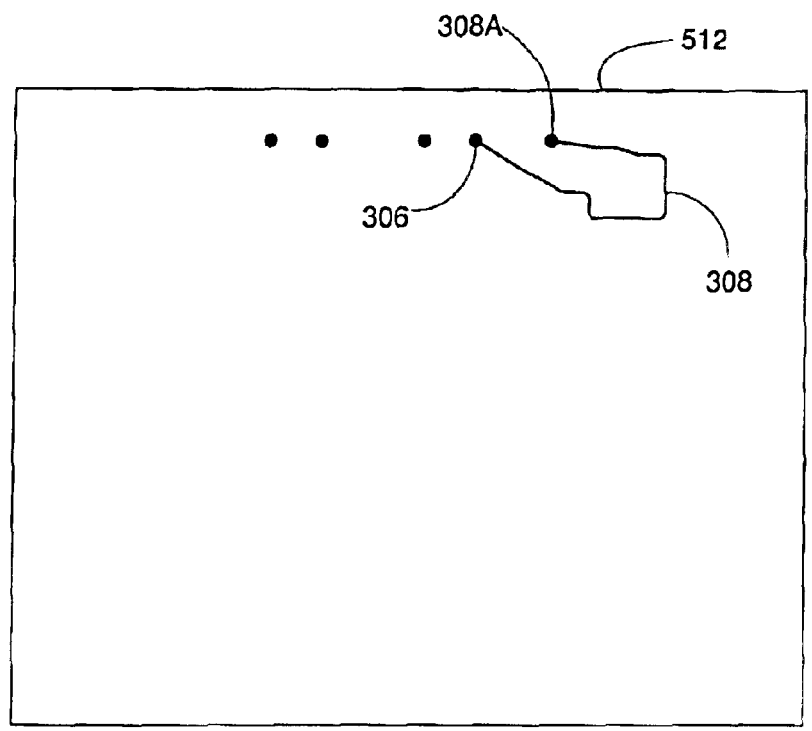

Referring to FIG. 5C that shows a conductive layer 512 that includes a DC bias network 308, such as described in FIG. 3 above. The DC bias network 308 has a length of about one quarter wavelength and therefore is an RF short which substantially blocks any RF from the PA output 306 from being input to the DC bias source 309 that is coupled to the terminal 308A. The DC bias network 308 is shaped and separated such that the line any signal cross coupling within the DC bias network 308 is minimized.

Referring again to FIG. 5A, an insulating via layer 513 is formed between the conductive layer 512 and another conductive layer 514. The insulating via layer 513 includes only those interconnecting vias as are required to form connection between the two conductive layer 512, 514 as are well known in the art in multi-layer structures.

Figure 5D:
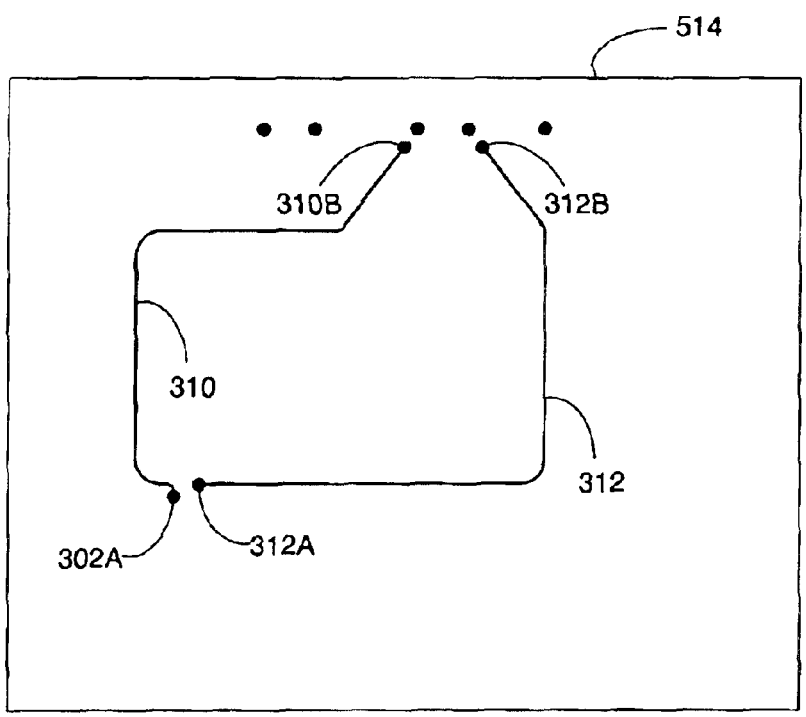

Referring to FIG. 5D that shows a conductive layer 514 that includes two output portions 310, 312 of a balun, such as described in FIG. 3 above. The output portions 310, 312 are substantially aligned vertically with the input portions 302A/302B formed in layer 510 so as to allow signals to be cross-coupled from the input portions 302A/302B to the output portions 310, 312. Output portion 310 is formed between a ground potential terminal 310B and an antenna terminal 310A. Similarly, output portion 312 is formed between two ground potential terminals 312B, 312A. Each of the output portions 310, 312 have a length of about one quarter wavelength as described above in FIG. 3.

As used herein the term "about" means +/-10%. By way of example, the phrase "about 250" indicates a range of between 225 and 275.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A transmitter output circuit comprising:
a first and a second differential outputs of a PA, the first differential output coupled to the second differential output by a first conductor that has a length of about a multiple of one half wavelength, the first and the second differential outputs having a parasitic capacitance;
a second conductor that is coupled to the first differential output, the second conductor having a length that is less than or equal to about one quarter wavelength plus a multiple of one half wavelength, the second conductor having an inductive reactance that offsets a capacitive reactance of the parasitic capacitance, the second conductor includes a DC bias network.

2. The circuit of claim 1, wherein the first conductor that has a length of about a multiple of one half wavelength can include a length of about one half wavelength.

3. The circuit of claim 1 wherein, the second conductor having a length that is equal to or less than about one quarter wavelength plus a multiple of one half wavelength can include a length that is equal to or less than about one quarter wavelength.

4. The circuit of claim 1, wherein the first conductor is formed such that a signal cross coupling between portions of the first conductor is minimized.

5. The circuit of claim 1, wherein the second conductor is formed such that a signal cross coupling between portions of the second conductor is minimized.

6. The circuit of claim 1, wherein the first conductor and the second conductor are separated such that a signal cross coupling between the first conductor and the second conductor is minimized.

7. The circuit of claim 1, further comprising a balun including:
a primary portion that includes the first conductor; and
a secondary portion including:
a third conductor; and
a fourth conductor, the third conductor and the fourth conductor having a length equal to about one quarter wavelength, the fourth conductor being coupled between a ground potential and an antenna port, the third conductor and the fourth conductor being substantially aligned with the first conductor so as to maximize a signal cross coupling from the first conductor to the third conductor and the fourth conductor.

8. The circuit of claim 7, wherein the balun is formed in a structure that includes a plurality of layers.

9. The circuit of claim 8, wherein the first conductor is formed on a first layer of the plurality of layers and the third conductor and the fourth conductor are formed on a second layer of the plurality of layers and a insulating third layer of the plurality of layers separates the first layer and the second layer.

10. The circuit of claim 7, wherein the balun is formed in a coupled line structure.

11. The circuit of claim 1, wherein the transmitter output circuit is included in a package.

12. The circuit of claim 11, wherein the package is an LTCC package.

13. A DC bias network for supplying bias current to a differential amplifier comprising:
a first conductor, the first conductor being coupled between a DC bias source and a first output of the differential amplifier, a second output of the differential output being coupled to the first output by a second conductor having a length of about one half wavelength plus a multiple of one half wavelength, the first conductor having a length of about one quarter wavelength plus a multiple of one half wavelength and an inductive reactance equal to a parasitic capacitive reactance on the first output and the second output of the differential amplifier, the first conductor includes the DC bias network.

14. The DC bias network of claim 13, wherein the DC bias network is included in a package, the package including an amplifier output circuit.

15. The DC bias network of claim 14, wherein the second conductor having a length of about one half wavelength plus a multiple of one half wavelength can include a length of about one half wavelength.

16. The DC bias network of claim 13, wherein the first conductor having a length of about one quarter wavelength plus a multiple of one half wavelength can include a length of one quarter wavelength.

17. A method of compensating for a parasitic capacitance on a differential amplifier output comprising: coupling a first differential output of the differential amplifier to a second differential output of the differential amplifier with a first conductor having a length of about one half wavelength plus a multiple of one half wavelength; and coupling a second conductor to the first differential output of the differential amplifier, the second conductor having a length of about one quarter wavelength plus a multiple of one half wavelength and an inductive reactance equal to a parasitic capacitive reactance on the first output and the second output of the differential amplifier, the second conductor includes a DC bias network.

18. The method of claim 17, wherein the first conductor that has a length of about one half wavelength plus a multiple of one half wavelength can include a length of about one half wavelength.

19. The method of claim 17, wherein the second conductor having a length of about one quarter wavelength plus a multiple of one half wavelength can include a length of about one quarter wavelength.

* * * * *